(12) United States Patent
Wang et al.

(10) Patent No.: US 12,040,428 B2
(45) Date of Patent: Jul. 16, 2024

(54) TRANSFERRING HEAD AND METHOD FOR MANUFACTURING ELECTRONIC DEVICE

(71) Applicant: InnoLux Corporation, Miao-Li County (TW)

(72) Inventors: Hui-Chieh Wang, Miao-Li County (TW); Tsau-Hua Hsieh, Miao-Li County (TW); Fang-Ying Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/116,259

(22) Filed: Mar. 1, 2023

(65) Prior Publication Data

US 2023/0215970 A1    Jul. 6, 2023

Related U.S. Application Data

(63) Continuation of application No. 16/808,303, filed on Mar. 3, 2020, now Pat. No. 11,616,165.

(60) Provisional application No. 62/830,564, filed on Apr. 8, 2019.

(30) Foreign Application Priority Data

Dec. 12, 2019    (CN) .......................... 201911273714.9

(51) Int. Cl.
*H01L 33/00* (2010.01)
*H01L 21/687* (2006.01)
*H01L 25/075* (2006.01)

(52) U.S. Cl.
CPC .... *H01L 33/0095* (2013.01); *H01L 21/68714* (2013.01); *H01L 25/0753* (2013.01); *H01L 2933/0016* (2013.01)

(58) Field of Classification Search
CPC ...................... H01L 33/0095; H01L 21/68714
See application file for complete search history.

(56) References Cited

U.S. PATENT DOCUMENTS

| 2012/0227259 | A1* | 9/2012 | Badaye ................ G09G 3/3611 |
| | | | 29/846 |
| 2014/0159066 | A1* | 6/2014 | Hu .......................... H01L 24/75 |
| | | | 438/28 |
| 2015/0124369 | A1  | 5/2015 | Thiel |

(Continued)

FOREIGN PATENT DOCUMENTS

| CN | 104718609 A | 6/2015 |
| CN | 109545731 A | 3/2019 |

(Continued)

*Primary Examiner* — Ratisha Mehta
(74) *Attorney, Agent, or Firm* — Winston Hsu

(57) ABSTRACT

The present disclosure provides a transferring head and a method for manufacturing an electronic device. The transferring head includes a substrate, a head unit, and a plurality of connecting elements. The head unit includes an electrode and a cantilever supporting the electrode. Two adjacent ones of the connecting elements are disposed between the substrate and the head unit. The electrode and a part of the cantilever are suspended over the substrate, and the cantilever is connected between one of the plurality of connecting elements and the electrode. The electrode is spaced apart from the plurality of connecting elements when viewed along a normal direction of the substrate.

14 Claims, 8 Drawing Sheets

(56) References Cited

U.S. PATENT DOCUMENTS

2018/0076076 A1* 3/2018 Bathurst ............ H01L 21/67721
2019/0244846 A1* 8/2019 Hsieh .................... H01L 21/683
2019/0304817 A1* 10/2019 Ahn ....................... B65G 47/92

FOREIGN PATENT DOCUMENTS

TW          201818464 A    5/2018
TW            1635785 B    9/2018

* cited by examiner

TRANSFERRING HEAD AND METHOD FOR MANUFACTURING ELECTRONIC DEVICE

CROSS REFERENCE TO RELATED APPLICATIONS

This application is a continuation application of U.S. application Ser. No. 16/808,303, filed on Mar. 3, 2020, which claims the benefit of U.S. Provisional Application No. 62/830,564, filed on Apr. 8, 2019. The contents of these applications are incorporated herein by reference.

BACKGROUND OF THE DISCLOSURE

1. Field of the Disclosure

The present disclosure relates to a transferring head and a method for manufacturing an electronic device, and more particularly to a transferring head and a method for manufacturing an electronic device that uses the transferring head to transfer light-emitting elements.

2. Description of the Prior Art

Components and elements (such as light-emitting diodes) inside electronic devices are being developed with a trend towards miniaturization. As the number of microcomponents increases in the electronic devices, a transferring technique needs to be developed to transfer the microcomponents in bulk. However, many disadvantages are present in conventional transferring techniques; for example, transferring heads may have a low degree of freedom in terms of movement that introduces pickup failure or damages when picking up the microcomponents.

SUMMARY OF THE DISCLOSURE

According to an embodiment of the present disclosure, a transferring head is provided. The transferring head includes a substrate, a head unit, and a plurality of connecting elements. The head unit includes an electrode and a cantilever supporting the electrode. Two adjacent ones of the connecting elements are disposed between the substrate and the head unit. The electrode and a part of the cantilever are suspended over the substrate, and the cantilever is connected between one of the plurality of connecting elements and the electrode. The electrode is spaced apart from the plurality of connecting elements when viewed along a normal direction of the substrate.

According to an embodiment of the present disclosure, a method for manufacturing an electronic device is disclosed. First, a plurality of microcomponents on a first substrate is provided. A transferring head is provided, in which the transferring head includes an electrode including a first electrode and a second electrode spaced apart from each other. Then, different voltages are applied to the first electrode and the second electrode respectively such that an electric field is generated between the first electrode and the second electrode, thereby causing electrostatic induction between the electrode and at least one of the microcomponents. Next, the at least one of the microcomponents is transferred from the first substrate to a second substrate by the transferring head.

These and other objectives of the present disclosure will no doubt become obvious to those of ordinary skill in the art after reading the following detailed description of the embodiment that is illustrated in the various figures and drawings.

DETAILED DESCRIPTION

Figure 1:
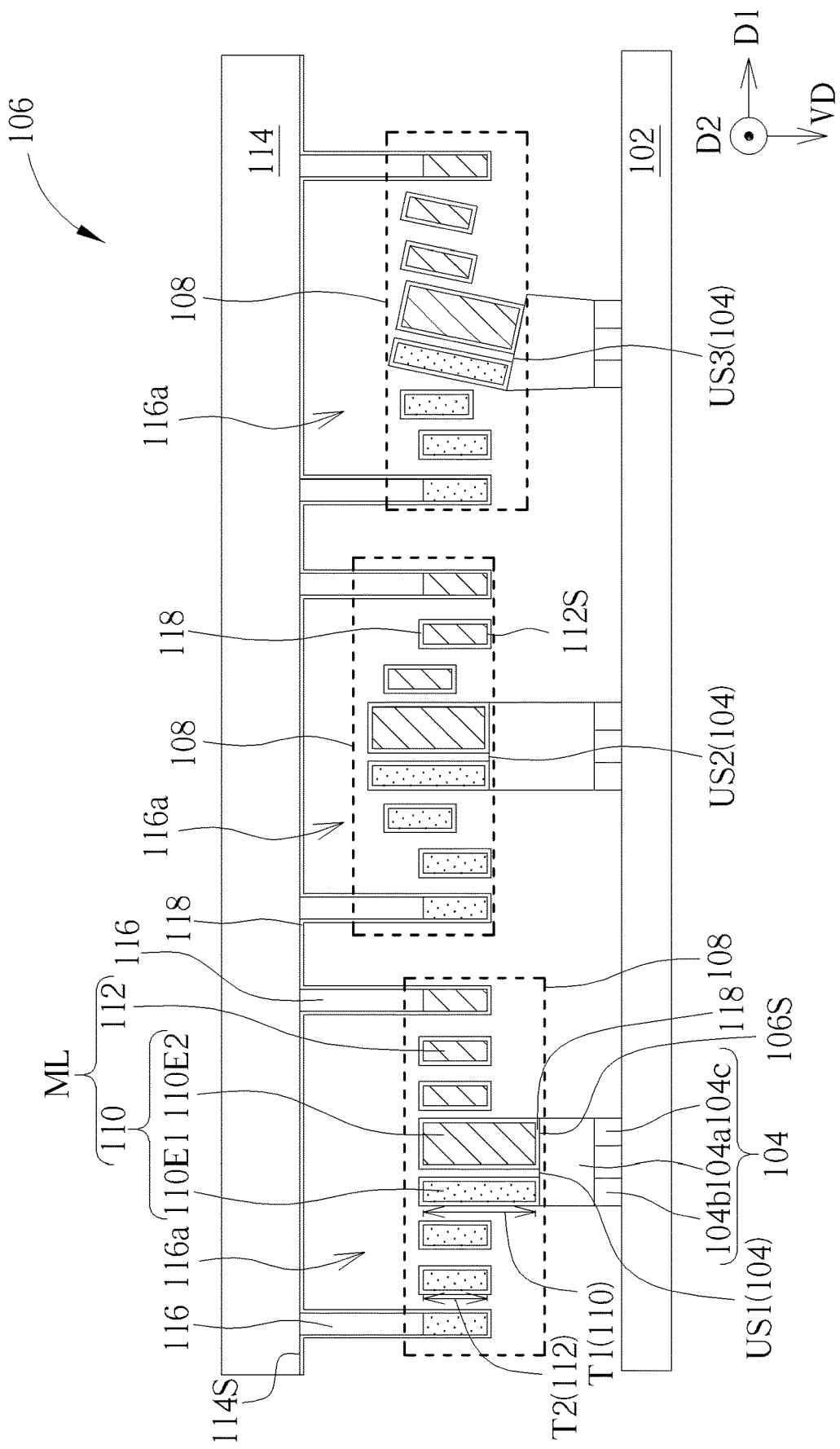
FIG. 1 to FIG. 3 are schematic diagrams of a method for manufacturing an electronic device according to a first embodiment of the present disclosure.

The present disclosure may be understood by reference to the following detailed description, taken in conjunction with the embodiments and drawings as described below. It is noted that, for purposes of illustrative clarity and being easily understood by the readers, various drawings of this disclosure may be simplified schematic diagrams; certain elements within may not be drawn to scale. In addition, the number and dimension of each element shown in drawings are illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not in function. In the following description and in the claims, the terms "include", "comprise" and "have" are used in an open-ended fashion, and thus should be interpreted to mean "include, but not limited to . . . ".

Terms describing directions such as "upper," "lower," "front," "back," "left" or "right" are directions within the various reference drawings. Therefore, such directional terms are just for illustrative purposes and not intended to limit the scope of the present disclosure. The features illustrated in the reference drawings are general features applicable to specific embodiments of methods, structures and/or materials. However, the drawings should not be interpreted as the scope, definitions or limitations of the aspects of embodiments. For example, relative dimensions, thicknesses and positions of layers, areas and/or structures may be reduced or enlarged for clarity.

When a corresponding element such as a layer or an area is said to be "on another element," it may be interpreted as being directly on another element, or being on another element while sandwiching other elements therebetween. On the other hand, when an element is "directly on another element," no other elements are located between the element and the another element. Furthermore, when an element is "on another element," the two elements are above-below relation when viewed in top view; the element may be above or below the another element depending on an orientation of a device including the elements.

It should be understood that, when an element or a layer is "connected to" another element or layer, it may be directly connected to the another element or layer, and other elements or layers may be inserted therebetween. When an element is "directly connected to" another element or layer, no other elements or layers are inserted therebetween. Furthermore, when an element is "coupled to another element (or its alternatives)," the element may be directly connected to the another element, or indirectly connected (such as electrically coupled) to the another element through one or more additional elements.

Here, the terms "about," "equivalent to", "approximately" and "substantially" usually means within 20% of a given value or a given range, or within 10%, 5%, 3%, 2%, 1% or 0.5%.

Although the terms such as first, second, etc. may be used in the description and following claims to describe various elements in claims, these terms do not mean or represent the claimed elements follow certain order and do not represent the order of one claimed element and another claimed element, or their manufacturing sequence. These terms are used to discriminate a claimed element with a denomination from another claimed element with the same denomination.

It should be noted that the technical features in different embodiments described in the following description may be replaced, recombined, or mixed with one another to constitute another embodiment without departing from the spirit of the present disclosure.

The electronic device of the present disclosure may include a display device, a light-emitting device, a sensing device, a tiling device, other suitable devices or combinations of the aforementioned devices and not limited thereto. The display device may be a bendable, flexible or foldable device.

Figure 2:
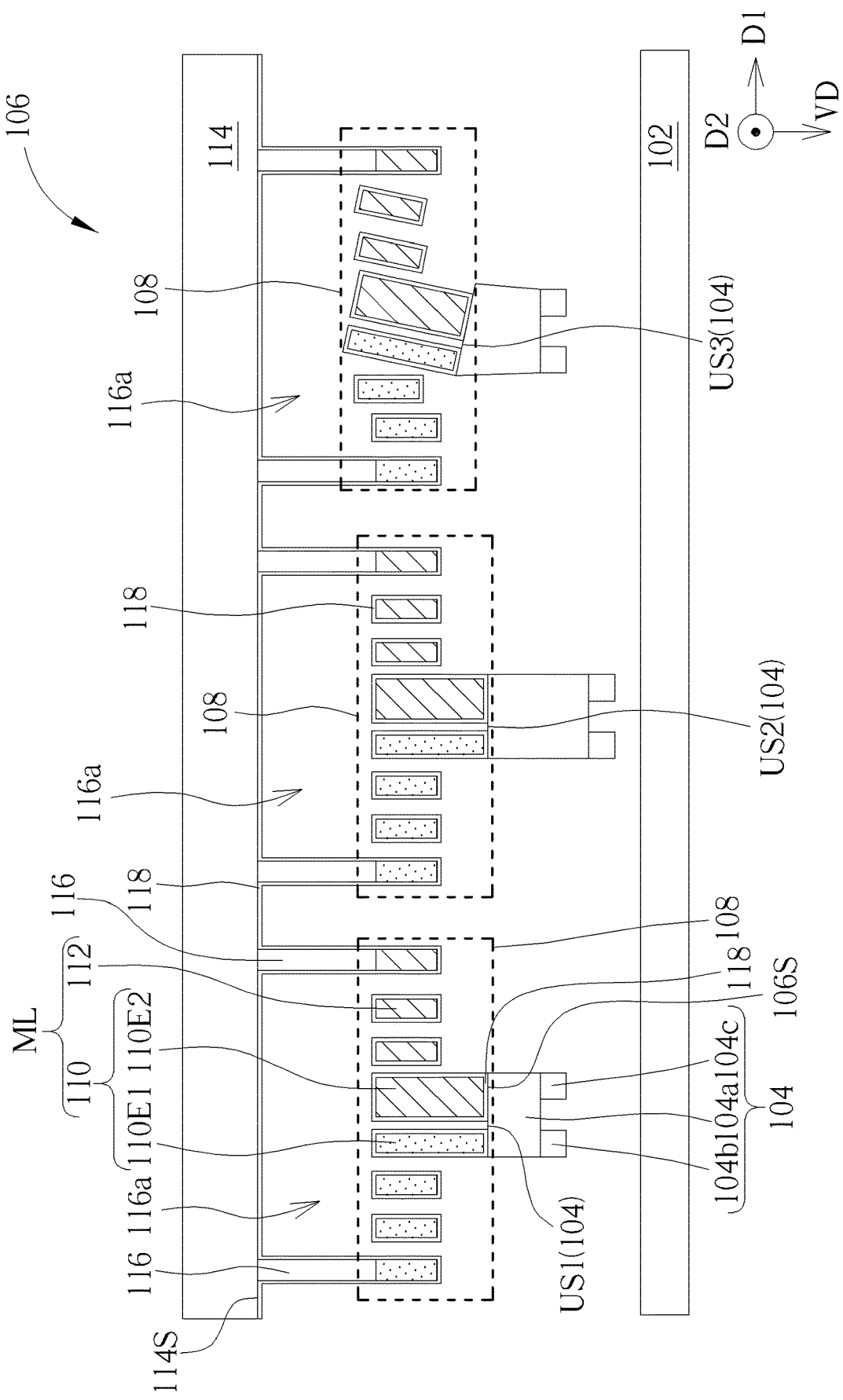
Figure 3:
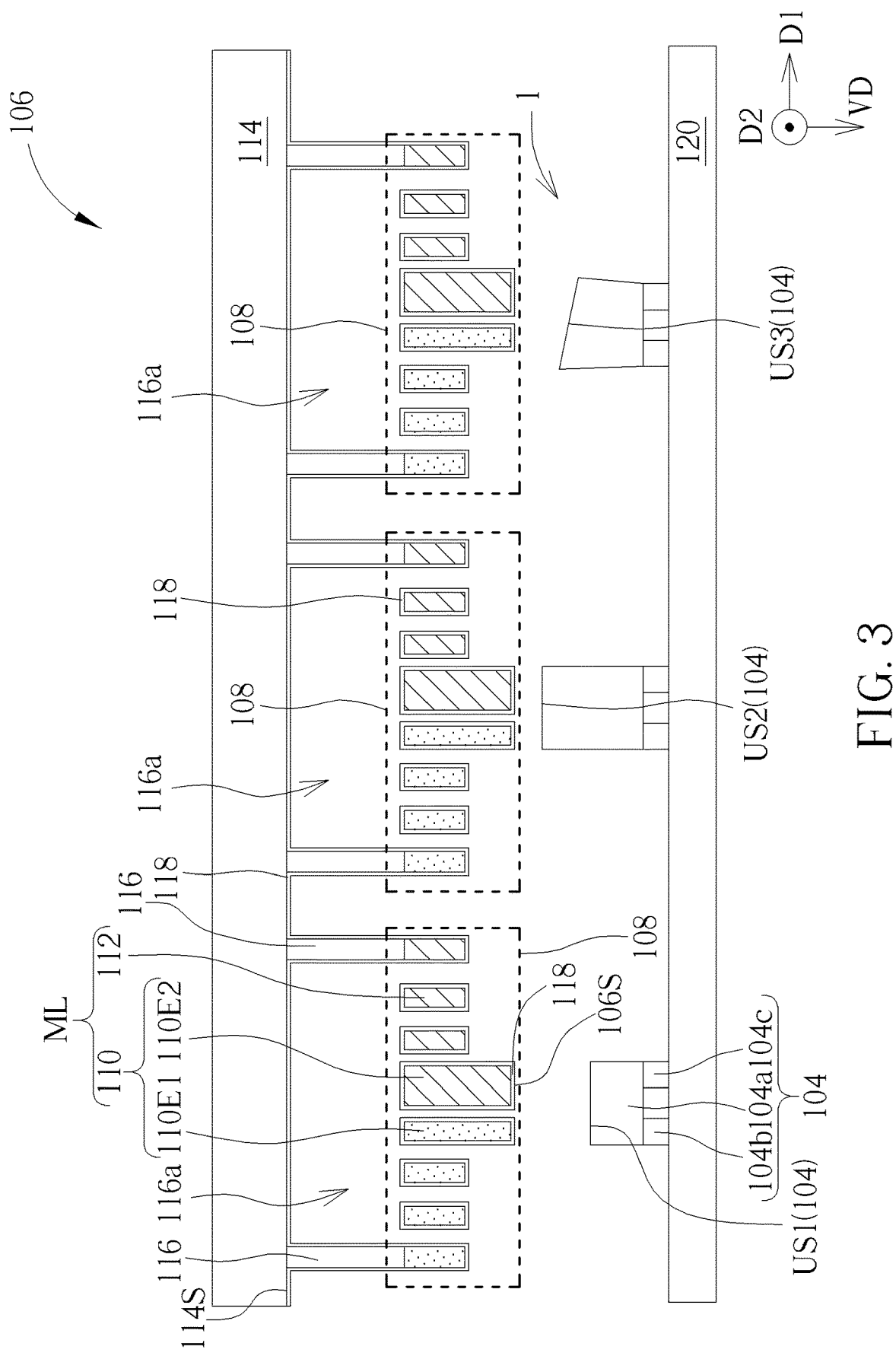

FIG. 1 to FIG. 3 are schematic diagrams of a method for manufacturing an electronic device according to a first embodiment of the present disclosure. In the following description, refer to FIG. 1 through FIG. 3 along with FIG. 6, wherein FIG. 6 schematically illustrates a top view of a head unit according to the first embodiment of the present disclosure. Wherein, the head unit 108 shown in FIG. 1 through FIG. 3 may for example be illustrated in a cross sectional view taken along a line A-A' of FIG. 6, but the head unit of the present disclosure is not limited thereto. First, as shown in FIG. 1, a plurality of light-emitting elements 104 is provided on a first substrate 102. Three light-emitting elements 104 are illustrative of examples in FIG. 1 through FIG. 3, but the number of the light-emitting elements 104 is not limited thereto. The light-emitting element 104 includes a light-emitting diode (LED), a mini-LED or a micro-LED, quantum dot (QD) material(s), a quantum-dot light-emitting diode (QLED, QDLED), fluorescent material(s), phosphorescent material(s), other suitable materials or combinations thereof, but the light-emitting element 104 is not limited thereto. The light-emitting element 104 may emit, for example, red, green, blue or other suitable wavelengths of light, but the present disclosure is not limited thereto. Detailed layers of the light-emitting element 104 will be described in reference to FIG. 5 in subsequent paragraphs. In some embodiments, a contact pad 104b and a contact pad 104c may respectively be an anode and a cathode of the light-emitting element 104. The contact pad 104b and the contact pad 104c are disposed for example on a same side of a semiconductor body 104a, such as a side of the semiconductor body 104a close to the first substrate 102, but are not limited there to. In some embodiments, the first substrate 102 may for example be a temporary carrier substrate of the light-emitting element 104. The first substrate 102 may include glass, quartz, ceramic, sapphire, polyimide (PI), polyethylene terephthalate (PET), other suitable materials or combinations of the aforementioned materials, but is not limited thereto. In some embodiments, the first substrate 102 may include a hard substrate, a soft substrate or a flexible substrate. In some embodiments, the light-emitting element 104 may include a conductive pattern (in the present embodiment, the semiconductor body 104a may be considered as the conductive pattern) used to contact a transferring head 106.

Then, as shown in FIG. 1 to FIG. 3, at least one of the plurality of light-emitting elements 104 is transferred from the first substrate 102 to a second substrate 120 by the transferring head 106. In some embodiments, the transferring head 106 may include a plurality of head units 108 respectively for picking up corresponding light-emitting elements 104. As an illustration of an example of the present disclosure, one head unit 108 is used to pick up a corresponding light-emitting element 104, but is not limited thereto. In other embodiments (not illustrated), one head unit 108 may for example pick up a plurality of corresponding light-emitting elements 104. Specifically, the transferring head 106 (such as the head unit 108) may include an electrode 110 and a cantilever 112, wherein the cantilever 112 is connected to and supports the electrode 110. In some embodiments, the electrode 110 of the head unit 108 may for example have a picking surface 106S. The picking surface 106S may for example face the light-emitting element 104 when the head unit 108 picks up the light-emitting element 104 by the electrode 110. In some embodiments, the electrode 110 may include two sub-electrodes (such as a sub-electrode 110E1 and a sub-electrode 110E2), and the sub-electrode 110E1 (corresponding to one of a first sub-electrode and a second sub-electrode of the claims) and the sub-electrode 110E2 (corresponding to the other one of the first sub-electrode and the second sub-electrode of the claims) may be spaced apart from each other, but not limited thereto. In some embodiments (not illustrated), the electrode 110 may for example not be divided into two sub-electrodes (that is, not divided into the first sub-electrode and the second sub-electrode); the electrode 110 may for example be integrally formed as one piece, but the electrode 110 of the present disclosure is not limited thereto.

Refer to FIG. 1 through FIG. 3. In some embodiments, the electrode 110 and the cantilever 112 may for example include the same material, but are not limited thereto. In other words, the electrode 110 and the cantilever 112 may for example be integrally formed as one piece. In some embodiments, the electrode 110 and/or the cantilever 112 may for example include a semiconductor material, a transparent conductive material, a metallic material or combinations of the aforementioned materials, but are not limited thereto. The semiconductor material may include silicon, germanium or combinations of the aforementioned materials, but are not limited thereto. In some embodiments, the electrode 110 and/or the cantilever 112 may include a single layer of material or multiple layers of material, but is not limited thereto. In some embodiments, the electrode 110 and/or the cantilever 112 may for example include a material layer ML (such layer may be a semiconductor material)

having dopants that allow the material layer ML to be conductive. In some embodiments, external circuits (not shown) may provide a voltage to the cantilever 112, and the voltage may for example be transmitted to the electrode 110 by the cantilever 112, but the present disclosure is limited thereto. In some embodiments, the dopants may for example include n-type dopants, p-type dopants or other suitable materials, but not limited thereto.

Refer to FIG. 1 through FIG. 3. The transferring head 106 may include a substrate 114, a plurality of connecting elements 116 and/or a dielectric layer 118, but not limited thereto. In some embodiments, the substrate 114 may for example be a soft substrate or a hard substrate. In some embodiments, the substrate 114 may optionally include a circuit for transmitting a voltage to the electrode 110, but the circuit is not limited thereto. In some embodiments, the connecting element 116 is for example disposed between the head unit 108 and the substrate 114. In some embodiments, the connecting element 116 may for example be connected to or contact the cantilever 112 in a way for fixing the cantilever 112 on the substrate 114 by the connecting element 116, but the present disclosure is not limited thereto. In some embodiments, an opening 116a may form between two adjacent ones of the connecting elements 116. In some embodiments, when viewed along the top view direction VD, the electrode 110 and/or the cantilever 112 may for example overlap with the opening 116a such that the electrode 110 and a part of the cantilever 112 are suspended over the opening 116a, in order to increase freedom of movement of the electrode 110 and the cantilever 112. In this way, the picking surface 106S of the electrode 110 may have freedom of multi-directional movement or freedom of rotation to increase a possibility of successfully picking up the light-emitting element 104. In some embodiments, a material of the connecting element 116 may for example include insulating materials such as silicon dioxide, other suitable materials or combinations of the aforementioned materials, but not limited thereto. In some embodiments, the transferring head 106 may selectively include a circuit board (not shown), and the electrode 110 and/or the cantilever 112 is electrically connected to a control device (or power source) through the circuit board. In some embodiments (not illustrated), a via may form in the substrate 114, a conductive material may for example be disposed in the via, and the cantilever 112 may for example be electrically connected to the control device (or power source) through the conductive material in the via. In some embodiments (not illustrated), the cantilever 112 may be electrically connected to an external circuit (not illustrated) through other conductive line connected between them.

Refer to FIG. 1 through FIG. 3. In some embodiments, the dielectric layer 118 may for example be disposed on a surface 114S of a part of the substrate 114, wherein the surface 114S may for example be a surface of the substrate 114 adjacent to the head unit 108. In some embodiments, the dielectric layer 118 may be disposed on the cantilever 112. In some embodiments, the dielectric layer 118 on the surface 114S and the dielectric layer 118 on the head unit 108 (including the cantilever 112 and the electrode 110) may be connected to each other, but the present disclosure is not limited thereto. In other words, the dielectric layer 118 on the surface 114S and the dielectric layer 118 on the head unit 108 may for example be formed in the same process, but not limited thereto. In some embodiments, the dielectric layer 118 may be formed using an atomic layer deposition (ALD) or other suitable methods. In some embodiments, the dielectric layer 118 may cover the connecting element 116 and/or the head unit 108. In some embodiments, by means of disposing the dielectric layer 118 on the electrode 110 of the transferring head 106, the electrode 110 and the light-emitting element 104 may be electrically insulated from each other when the transferring head 106 contacts the light-emitting element 104.

In some embodiments, the electrode 110 includes the sub-electrode 110E1 and the sub-electrode 110E2, and the sub-electrode 110E1 and the sub-electrode 110E2 may be applied with different voltages (such as voltages of different polarities, such that an electric field (such as a fringe electric field) is generated between the sub-electrode 110E1 and the sub-electrode 110E2, thereby causing electrostatic induction between the electrode 110 and the light-emitting element 104. When electrostatic induction is produced between the electrode 110 and the light-emitting element 104, induced charges may for example be generated between the light-emitting element 104 and the transferring head 106 so as to adsorb or pick up the light-emitting element 104. In some embodiments, a voltage difference applied between the sub-electrode 110E1 and the sub-electrode 110E2 may be larger than 0V and smaller than or equal to 110V (0V<the voltage difference≤110V), but not limited thereto. In some embodiments, the voltage difference applied between the sub-electrode 110E1 and the sub-electrode 110E2 may be larger than or equal to 10V and smaller than or equal to 80V (10V≤the voltage difference≤80V), but not limited thereto.

In some embodiments, the dielectric layer 118 may include an insulating material, such as a dielectric material with a high dielectric constant or other suitable materials. The dielectric layer 118 may for example include aluminum oxide, silicon oxide, other suitable materials or combinations of the aforementioned materials, but not limited thereto.

Refer to FIG. 1 through FIG. 3 and FIG. 6. In some embodiments, when viewed along a cross sectional direction, a thickness of the electrode 110 is for example greater than a thickness of the cantilever 112, but not limited thereto. In some embodiments, when the electrode 110 and the cantilever 112 are for example formed from the same material layer (such as the material layer ML), the electrode 110 may be defined as a portion of the material layer ML with a larger thickness, and the cantilever 112 may be defined as a portion of the material layer ML with a smaller thickness. In some embodiments (as shown in FIG. 1 through FIG. 6), when the electrode 110 and the cantilever 112 are for example formed from the same material layer (such as the material layer ML), the electrode 110 may substantially correspond to a center portion of the material layer ML. By means of designing the thickness of the electrode 110 to be greater than the thickness of the cantilever 112, the electrode 110 may be closer to the light-emitting element 104 than the cantilever 112 when the transferring head 106 contacts the light-emitting element 104, such that an alignment accuracy of transferring the light-emitting element 104 to the second substrate 120 can be increased when the electrode 110 is used to pick up the corresponding light-emitting element 104. In other words, by designing the thickness of the electrode 110 to be greater than the thickness of the cantilever 112, the light-emitting element 104 is less likely to be picked up by the cantilever 112 erroneously. In some embodiments, a difference between a thickness T1 of the electrode 110 and a thickness T2 of the cantilever 112 may be greater than or equal to 20 μm and less than or equal to 70 μm (20 μm≤T1−T2≤70 μm), but not limited thereto. In some embodiments, the difference between the thickness T1 of the electrode 110 and the thickness T2 of the cantilever 112 may be greater than or equal to 30 μm and less than or equal to 60 μm (30 μm≤T1–T2≤60 μm), but not limited thereto. In other embodiments (not illustrated), when viewed along the cross sectional direction, the thickness T1 of the electrode 110 may for example be substantially equal to or greater than the thickness T2 of the cantilever 112, and the material of the electrode 110 may for example have a larger electrical conductivity compared to the material of the cantilever 112.

Figure 4:
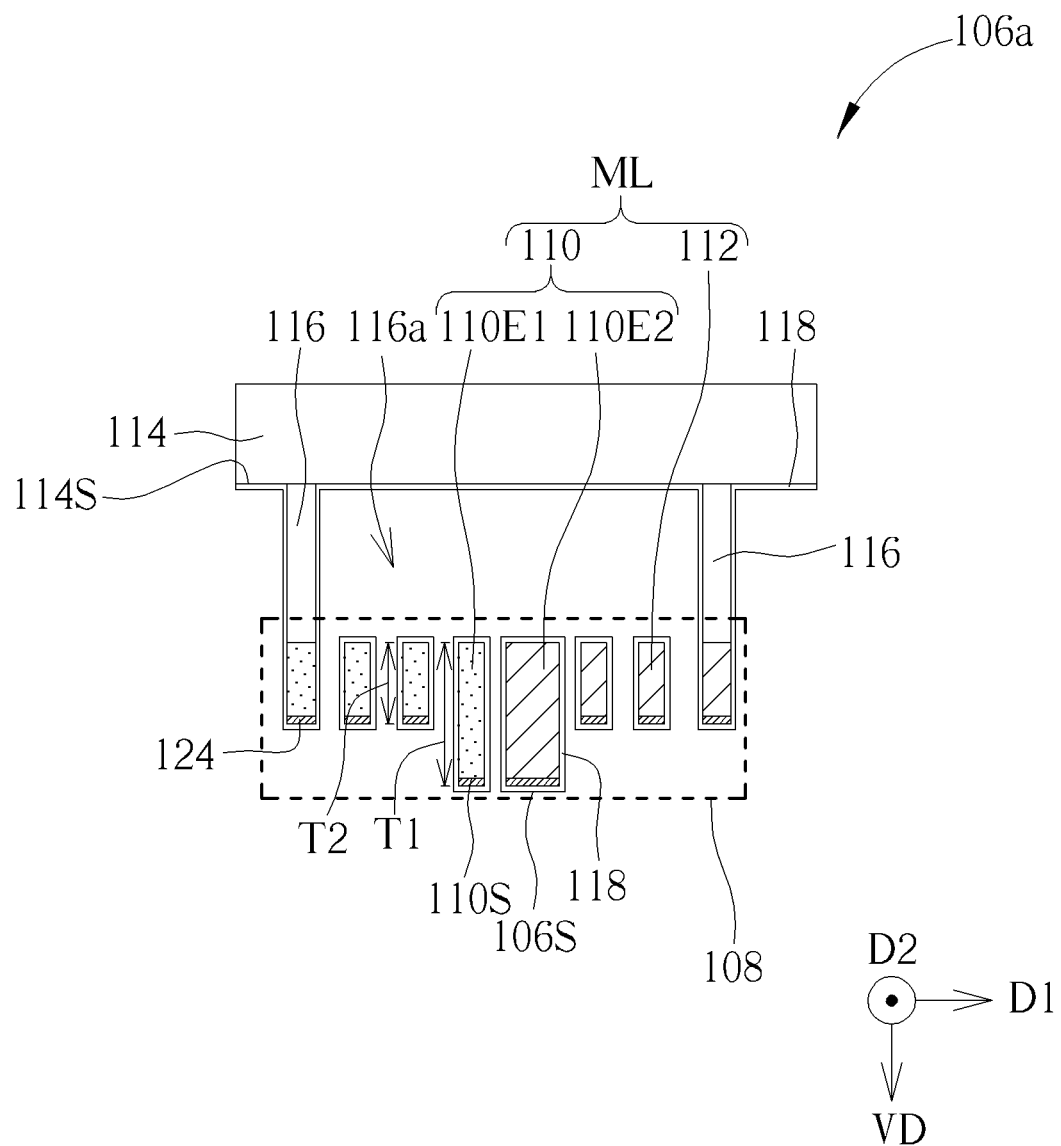
FIG. 4 schematically illustrates a cross sectional view of a transferring head of an alternate embodiment according to the first embodiment of the present disclosure.

Refer to FIG. 4, a schematic cross sectional view of the transferring head according to an alternative embodiment of the first embodiment of the present disclosure. A head unit is shown on the transferring head of FIG. 4, but the number of head units is not limited thereto. A difference between the transferring head 106a of FIG. 4 and the transferring head 106 of FIG. 1 is that the transferring head 106a further includes a conductive layer 124, and the conductive layer 124 for example is disposed between an upper surface 110S of the electrode 110 and the dielectric layer 118. Specifically, in some embodiments, when the material of the electrode 110 includes a semiconductor material without dopants, through the extra conductive layer 124, the electrostatic induction may be generated between the conductive layer 124 and the light-emitting element 104. In some embodiments, the conductive layer 124 may be disposed between at least a part of the cantilever 112 and the dielectric layer 118. In some embodiments, the conductive layer 124 may be disposed between the connecting element 116 and the dielectric layer 118.

Please continue to refer to FIG. 1 to FIG. 3. Detailed steps to transfer the light-emitting element 104 from the first substrate 102 to the second substrate 120 will be described below. As shown in FIG. 1, the transferring head 106 is moved such that the picking surfaces 106S of different electrodes 110 of the transferring head 106 respectively contacts the light-emitting elements 104 that is to be picked up. In some embodiments, upper surfaces (such as a surface away from the first substrate 102) of different light-emitting elements 104 may for example not be on the same horizontal plane. The aforementioned horizontal plane may for example be a surface substantially parallel to a surface of the first substrate 102. For instance, as shown in FIG. 1, an upper surface US1 of the left most light-emitting element 104 and an upper surface US2 of the middle light-emitting element 104 are not on the same horizontal plane. In some embodiments, an upper surface US3 of the light-emitting element 104 (such as the right most light-emitting element 104) may for example be a tilted surface (or a curved surface); that is, the upper surface US3 may not be parallel to the surface of the first substrate 102. In some embodiments, the cantilever 112 may include a bending portion for increasing the freedom of movement of the picking surface 106S of the electrode 110; refer to subsequent descriptions regarding FIG. 6 for more details on the bending portion. By designing the cantilever 112 with the bending portion, different picking surfaces 106S may have more degrees of freedom to match with the upper surfaces of the light-emitting elements 104 when the transferring head 106 contacts the light-emitting elements 104, such that a contact area between the picking surface 106S and the corresponding light-emitting element 104 may be increased, thereby increasing a possibility of picking up the light-emitting element 104. As shown in FIG. 2, the light-emitting elements 104 may for example be adsorbed to the picking surfaces 106S of the electrodes 110 of the transferring head 106, and the light-emitting elements 104 may subsequently be separated from the first substrate 102.

As shown in FIG. 3, the transferring head 106 is moved to the second substrate 120; then, the voltage on the electrode 110 is removed such that the light-emitting elements 104 may be separated from the transferring head 106 to be placed on the second substrate 120. An electronic device 1 of the present embodiment is thereby formed according to the steps shown in FIG. 1 through FIG. 3; however, the steps are not limited thereto; steps may be added or removed depending on requirements.

Figure 5:
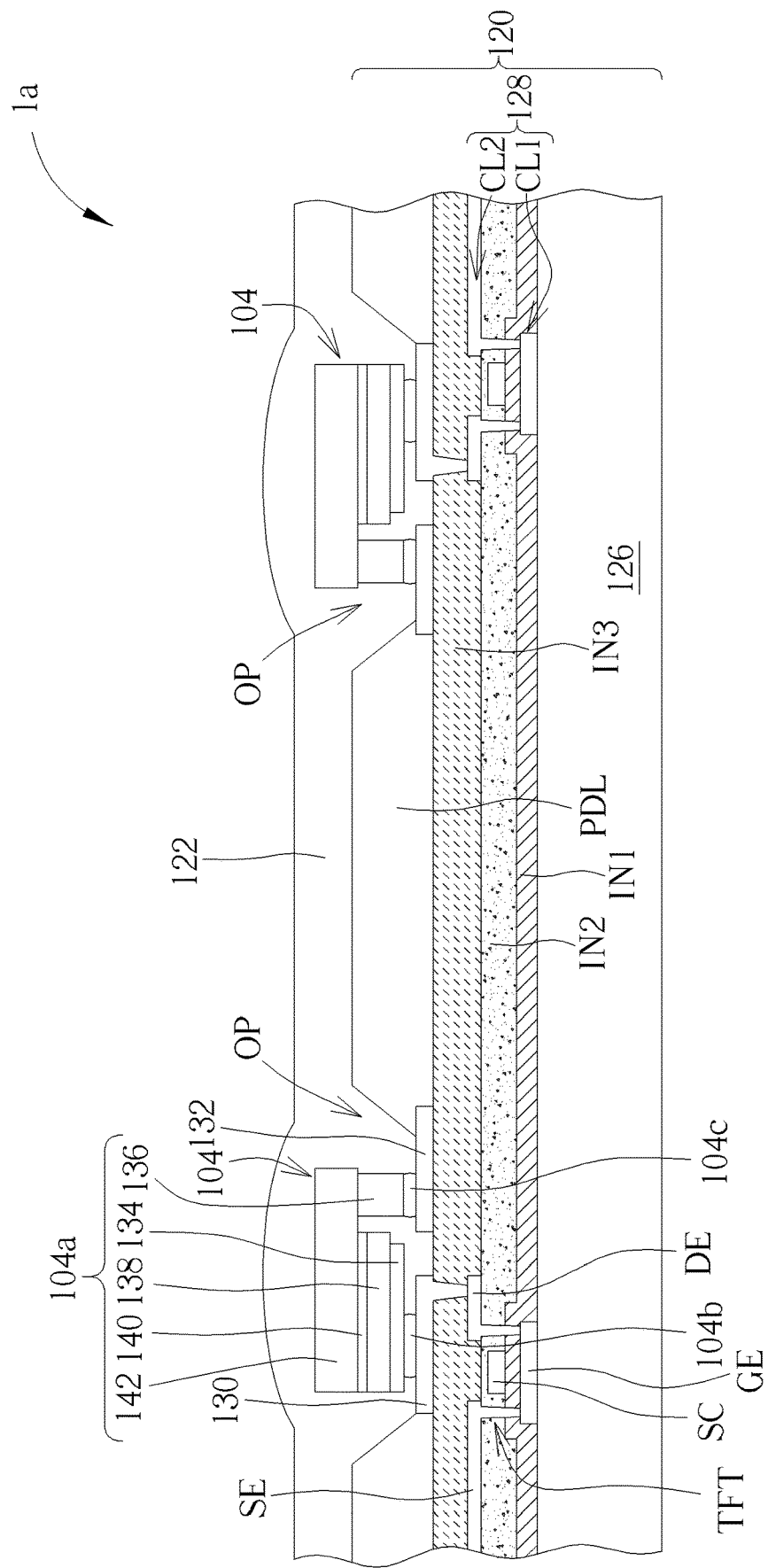
FIG. 5 schematically illustrates a cross sectional view of an electronic device according to an embodiment of the present disclosure.
Figure 6:
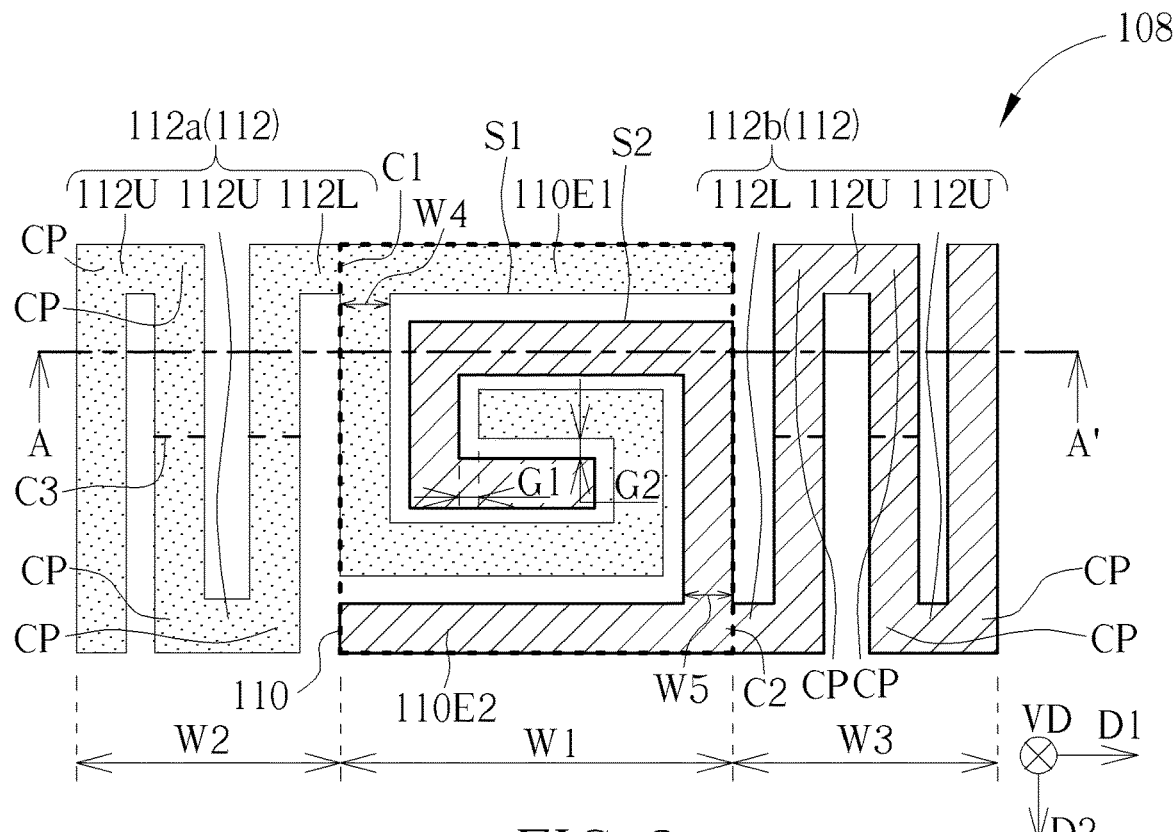
FIG. 6 schematically illustrates a top view of a head unit according to the first embodiment of the present disclosure.

Refer to FIG. 5, a schematic diagram of a cross sectional view of an electronic device according to an embodiment of the present disclosure. After disposing the light-emitting elements 104 on the second substrate 120, a protective layer 122 may be selectively formed on the light-emitting elements 104 and the second substrate 120. In some embodiments, the second substrate 120 may for example include a thin film transistor substrate or a circuit board, but not limited thereto. For example, the second substrate 120 may for example include a substrate 126 and a circuit structure layer 128, and the circuit structure layer 128 is used to transmit signals to the light-emitting elements 104 disposed on the second substrate 120. The substrate 126 may include a hard substrate or a flexible substrate; a material of the substrate 126 may for example include glass, ceramic, quartz, sapphire, polyimide (PI), polycarbonate (PC), polyethylene terephthalate (PET) or combinations of the aforementioned materials, but not limited thereto. In some embodiments, the substrate 126 may include a hard substrate, a soft substrate or a flexible substrate. In some embodiments, the circuit structure layer 128 may include a conductive layer CL1 for forming a gate electrode GE and/or a scan line (not illustrated), an insulating layer IN1, a semiconductor layer SC, an insulating layer IN2, and a conductive layer CL2 for forming a source electrode SE, a drain electrode DE and/or a data line (not illustrated), but the present disclosure is not limited thereto. The conductive layer CL1, the insulating layer IN1, the semiconductor layer SC, the insulating layer IN2 and the conductive layer CL2 may form a plurality of thin film transistors TFT, and the light-emitting elements 104 may be electrically connected to the thin film transistors TFT. Types of thin film transistors TFT are not limited to a bottom-gate type as shown in FIG. 5; they may include top-gate type, dual-gate type or other suitable types, but not limited thereto. In some embodiments, the protective layer 122 may for example include an inorganic material layer, an organic material layer or combinations of the aforementioned materials to reduce affection of moisture or oxygen. In some embodiments, the protective layer 122 may for example include a single-layer or multi-layered structure.

In some embodiments, the second substrate 120 may include an electrode 130, an electrode 132 and an insulating layer IN3, wherein the insulating layer IN3 is disposed on the circuit structure layer 128, the electrode 130 and the electrode 132 are disposed on the insulating layer IN3, and the electrode 130 is electrically connected to the thin film transistor TFT through the via of the insulating layer IN3. In some embodiments, the semiconductor layer SC may for example include metal oxide, amorphous silicon, low-temperature polysilicon (LIPS) or low-temperature polycrystalline oxide (LTPO), but not limited thereto. In some embodiments, different thin film transistors TFT may include semiconductor layers SC with various aforementioned materials, but not limited thereto. In some embodiments, the second substrate 120 may include a pixel-defining layer PDL disposed on the insulating layer IN3, and the pixel-defining layer PDL has a plurality of openings OP; light-emitting elements 104 may be disposed in the openings OP and be electrically connected to the electrodes 130 and the electrodes 132.

In some embodiments, the light-emitting element 104 (such as the semiconductor body 104*a*) may include a first electrode 134, a second electrode 136, a first semiconductor layer 138, a light-emitting layer 140 and a second semiconductor layer 142, but not limited thereto. The first electrode 134 is connected between the first semiconductor layer 138 and the contact pad 104*b*, and the second electrode 136 is connected between the second semiconductor layer 142 and the contact pad 104*c*. For example, the first semiconductor layer 138 may include one of a p-type semiconductor material and an n-type semiconductor material, and the second semiconductor layer 142 may include the other one of the p-type semiconductor material and the n-type semiconductor material, but not limited thereto. In some embodiments, the second semiconductor layer 142 may be a conductive pattern for contacting the transferring head 106, but not limited thereto.

It should be noted that, despite not being illustrated in FIG. 1 through FIG. 3, the cantilever 112 of the present embodiment along the top view direction VD may have at least one bending portion (such as a bending portion CP shown in FIG. 6). In some embodiments, in the top view direction VD, the cantilever 112 may include an L-shaped portion, a U-shaped portion or portions with other suitable shapes. Such shaped designs may increase the freedom of movement of the cantilever 112 and the electrode 110 connected to the cantilever 112, or increase the freedom of rotation of (the picking surface 106S of) the electrode 110. For example, when surfaces of the light-emitting elements 104 have different heights (that is, they are located on different horizontal planes) or are tilted, the cantilever 112 designed in the aforementioned manner allows the picking surface 106S of the transferring head 106 to adjust according to a surface condition of the corresponding light-emitting element 104 when the picking surface 106S of the transferring head 106 contacts the light-emitting element 104 (e.g. the surface of the light-emitting element 104); for example, a tilt degree of the picking surface 106S of the transferring head 106 or a distance between the picking surface 106S and the substrate 114 may be adjusted to increase the contact area between the picking surface 106S of the electrode 110 and the corresponding light-emitting element 104, thereby increasing the probability of pickup.

Refer to FIG. 6, a top view of a head unit according to the first embodiment of the present disclosure, wherein the head unit 108 shown in FIG. 1 through FIG. 3 or the head unit 108 shown in FIG. 4 may for example be illustrated as a cross sectional view taken along the line A-A' of FIG. 6, but the present disclosure is not limited thereto. In the following description, the head unit 108 of FIG. 1 through FIG. 3 is as an example. As shown in FIG. 6, the cantilever 112 may include at least two sub-cantilevers (e.g. a sub-cantilever 112*a* and a sub-cantilever 112*b*), wherein the sub-cantilever 112*a* and the sub-cantilever 112*b* are for example respectively connected to the sub-electrode 110E1 and the sub-electrode 110E2, and the sub-cantilever 112*a* and the sub-cantilever 112*b* are respectively used to support the sub-electrode 110E1 and the sub-electrode 110E2. In some embodiments, the sub-cantilever 112*a* and the sub-cantilever 112*b* may for example be separately connected to two opposite sides of the electrode 110, but is not limited thereto. In some embodiments, the sub-cantilever 112*a*, the electrode 110 and the sub-cantilever 112*b* may for example be arranged in sequence along a first direction D1, but is not limited thereto. In some embodiments (not illustrated), the head unit 108 may include at least one sub-cantilever connected to at least one side of the electrode 110. In some embodiments (not illustrated), the sub-electrode 110E1 and the sub-electrode 110E2 may have a curved edge respectively.

In some embodiments, when viewed along the top view direction VD, the sub-cantilever 112*a* and/or the sub-cantilever 112*b* may respectively have at least one bending portion. Specifically, the sub-cantilever 112*a* and/or the sub-cantilever 112*b* may include at least two bending portions CP that forms at least one U-shaped portion 112U. In some embodiments (not illustrated), the bending portion CP may be designed with a curved edge depending on requirements. In the head unit 108 shown in FIG. 6, the sub-cantilever 112*a* and/or the sub-cantilever 112*b* may for example have two U-shaped portions 112U, wherein the two U-shaped portions 112U for example face opposite directions; for instance, an opening of the U-shaped portion 112U may face upward, and an opening of the other U-shaped portion 112U may face downward, but the present disclosure is not limited thereto. The two U-shaped portions 112U may for example be connected to each other to form a serpentine shape (but not limited thereto), and the two U-shaped portions 112U may for example have a connecting area C3 respectively. In some embodiments, at least one of the sub-cantilever 112*a* and the sub-cantilever 112*b* may selectively include an L-shaped portion 112L connected between the U-shaped portion 112U and the corresponding sub-electrode 110E1 (or the sub-electrode 110E2), but is not limited thereto. In some embodiments, the sub-cantilever 112*a* may be the sub-cantilever 112*b* when the sub-cantilever 112*a* is rotated substantially for 180 degrees, but is not limited thereto. In some embodiments (not illustrated), the sub-cantilever 112*a* and the sub-cantilever 112*b* may for example be mirror symmetrical to each other, but not limited thereto. In some embodiments (not illustrated), the sub-cantilever 112*a* and the sub-cantilever 112*b* may for example be asymmetric. In some embodiments, lengths and/or appearances of the sub-cantilever 112*a* and the sub-cantilever 112*b* may be the same or different, but not limited thereto.

In some embodiments, a connecting area C1 between the sub-cantilever 112*a* and the sub-electrode 110E1 and a connecting area C2 between the sub-cantilever 112*b* and the sub-electrode 110E2 may for example be located at different horizontal lines, and the horizontal lines may for example be parallel to the first direction D1. In some embodiments (not illustrated), the connecting area C1 between the sub-cantilever 112*a* and the sub-electrode 110E1 may for example be at the same horizontal line as the connecting area C2 between the sub-cantilever 112*b* and the sub-electrode 110E2. In some embodiments, when viewed along the first direction D1, a width W2 of the sub-cantilever 112*a* and/or a width W3 of the sub-cantilever 112*b* may be greater than or equal to 50 µm and less than or equal to 200 µm (50 µm≤W2≤200 µm; 50 µm≤W3≤200 µm), but not limited thereto. In some embodiments, when viewed along the first direction D1, the width W2 of the sub-cantilever 112*a* (and/or the width W3 of the sub-cantilever 112*b*) may be greater than or equal to 80 µm and less than or equal to 170 µm (80 µm≤W2≤170 µm; 80 µm≤W3≤170 µm), but not limited thereto. In some embodiments, the width W2 and the width W3 may be the same or different.

In some embodiments, when viewed along the top view direction VD, the sub-electrode 110E1 and/or the sub-electrode 110E2 may be spiral-shaped, but is not limited thereto. In some embodiments, when viewed along the top view direction VD, a shape of the sub-electrode 110E1 and/or a shape of the sub-electrode 110E2 may be comb-shaped or other suitable shapes. In some embodiments, when viewed along the top view direction VD, an outline of a pattern forming an exterior edge of the electrode 110 (as shown by a frame of thick dashed lines) may for example be a rectangular-shaped, circular-shaped, polygonal-shaped, arc-shaped or other suitably-shaped outline. A rectangular-shaped outline is illustrative of an example in FIG. 6, and the sub-electrode 110E1 and/or the sub-electrode 110E2 may include a plurality of sub-portions with varying lengths sequentially connected into a spiral, but not limited thereto. In some embodiments, the number of sub-portions of the sub-electrode 110E1 and the number of sub-portions of the sub-electrode 110E2 may be the same or different.

In some embodiments, the sub-electrode 110E1 and the sub-electrode 110E2 are spaced apart from each other. In some embodiments, a gap G1 and a gap G2 may be located between the sub-electrode 110E1 and the sub-electrode 110E2. The gap G1 may for example be the smallest distance between the sub-electrode 110E1 and the sub-electrode 110E2 along the first direction D1; the gap G2 may for example be the smallest distance between the sub-electrode 110E1 and the sub-electrode 110E2 along a second direction D2; wherein, the first direction D1 and the second direction D2 are different (the first direction D1 and the second direction D2 may be substantially orthogonal), but not limited thereto. In some embodiments, the gap G1 and the gap G2 may be the same or different. In some embodiments, a side S1 of the sub-electrode 110E1 may be adjacent to a side S2 of the sub-electrode 110E2. When different voltages are applied to the sub-electrode 110E1 and the sub-electrode 110E2, an electric field (such as a fringe electric field) may for example be formed between the side S1 of the sub-electrode 110E1 and the side S2 of the sub-electrode 110E2. In some embodiments, the electric field may increase with a length of the side S1 and the side S2, such that the force of attraction of the electrode 110 to the light-emitting element 104 may be increased. In some embodiments, the gap G1 (and/or the gap G2) may be greater than or equal to 3 µm and less than or equal to 500 µm (3 µm≤G1≤500 µm; 3 µm≤G2≤500 µm), but not limited thereto. In some embodiments, the gap G1 (and/or the gap G2) may be greater than or equal to 10 µm and less than or equal to 400 µm (10 µm≤G1≤400 µm; 10 µm≤G2≤400 µm), but not limited thereto. In some embodiments, the gap G1 (and/or the gap G2) may be greater than or equal to 100 µm and less than or equal to 300 µm (100 µm≤G1≤300 µm; 100 µm≤G2≤300 µm), but not limited thereto.

In some embodiments, a width W4 of the sub-electrode 110E1 and a width W5 of the sub-electrode 110E2 may for example be the same or different. The width W4 may for example be the largest width measured in a direction perpendicular to an extending direction of the sub-portion (one of the sub-portions of the sub-electrode 110E1), and the width W5 may for example be the largest width measured in a direction perpendicular to an extending direction of the sub-portion (one of the sub-portions of the sub-electrode 110E2). In some embodiments, the width W4 (and/or the width W5) may be greater than or equal to 1 µm and less than or equal to 500 µm (1 µm≤W4≤500 µm; 1 µm≤W5≤500 µm). In some embodiments, the width W4 (and/or the width W5) may be greater than or equal to 5 µm and less than or equal to 300 µm (5 µm≤W4≤300 µm; 5 µm≤W5≤300 µm). In some embodiments, when viewed along the first direction D1, the width W1 of the electrode 110 may for example be substantially the same as a width of the light-emitting element 104, but not limited thereto. In some embodiments, when viewed along the first direction D1, the width W1 of the electrode 110 may for example be greater than the width of the light-emitting element 104. In some embodiments, when viewed along the first direction D1, the width W1 of the electrode 110 may for example be less than the width of the light-emitting element 104. In some embodiments, when viewed along the top view direction VD, an area of the electrode 110 may for example be substantially the same as an area of the light-emitting element 104. In some embodiments, when viewed along the top view direction VD, the area of the electrode 110 may for example be greater than the area of the light-emitting element 104. In some embodiments, when viewed along the top view direction VD, the area of the electrode 110 may for example be less than the area of the light-emitting element 104.

Figure 7:
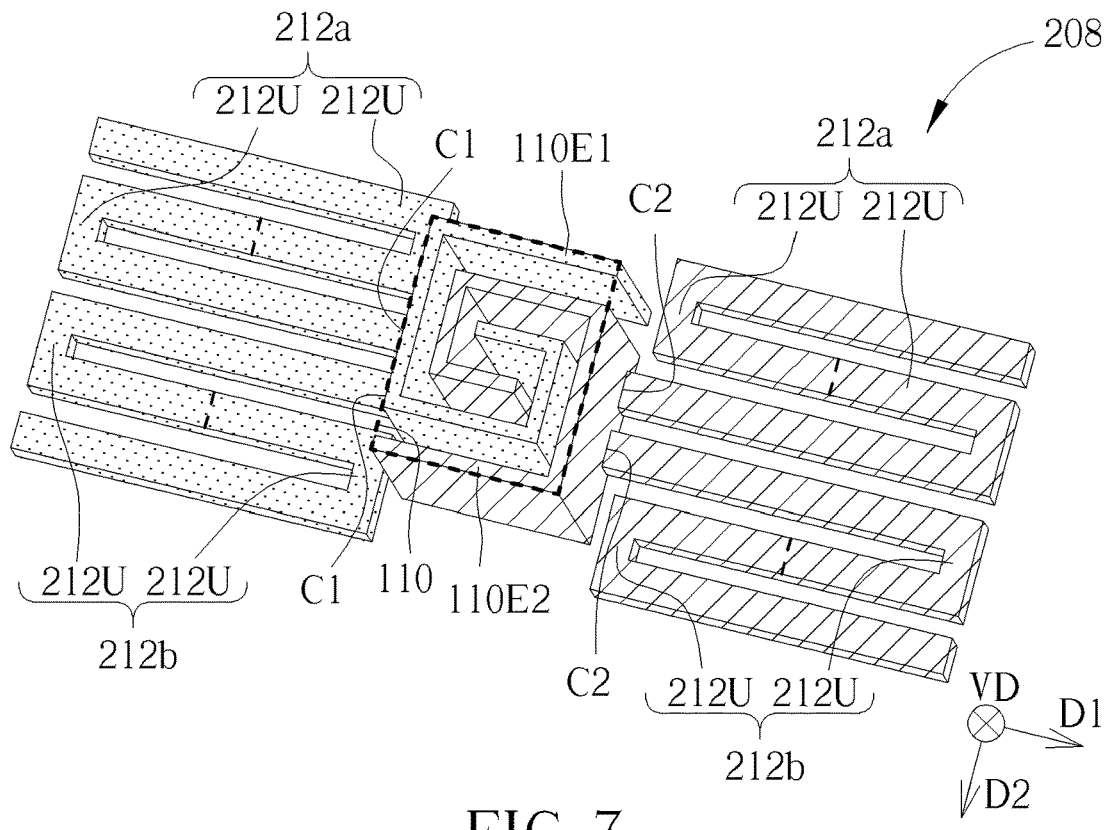
FIG. 7 schematically illustrates a top view of the head unit according to a second embodiment of the present disclosure.

FIG. 7 schematically illustrates a top view of the head unit according to a second embodiment of the present disclosure. As shown in FIG. 7, a difference between the head unit 208 and the head unit shown in FIG. 6 is that the sub-electrode 110E1 and/or the sub-electrode 110E2 may for example be connected to two sub-cantilevers (such as a sub-cantilever 212a and a sub-cantilever 212b), but is not limited thereto. In other embodiments, the number of sub-cantilevers connected to the sub-electrode may be adjusted depending on requirements. In some embodiments, the sub-cantilever 212a and/or the sub-cantilever 212b may for example be connected to a middle section of a side portion of the sub-electrode 110E1 (and/or the sub-electrode 110E2), but not limited thereto.

In some embodiments, the sub-cantilever 212a and/or the sub-cantilever 212b may include two U-shaped portions 212U, and the openings of the two U-shaped portions 212U may for example face different directions respectively, but not limited thereto.

In some embodiments, the sub-cantilever 212a and the sub-cantilever 212b connected to the same sub-electrode (such as the sub-electrode 110E1 or the sub-electrode 110E2) may be symmetrical to each other with respect to the first direction D1, but not limited thereto.

Figure 8:
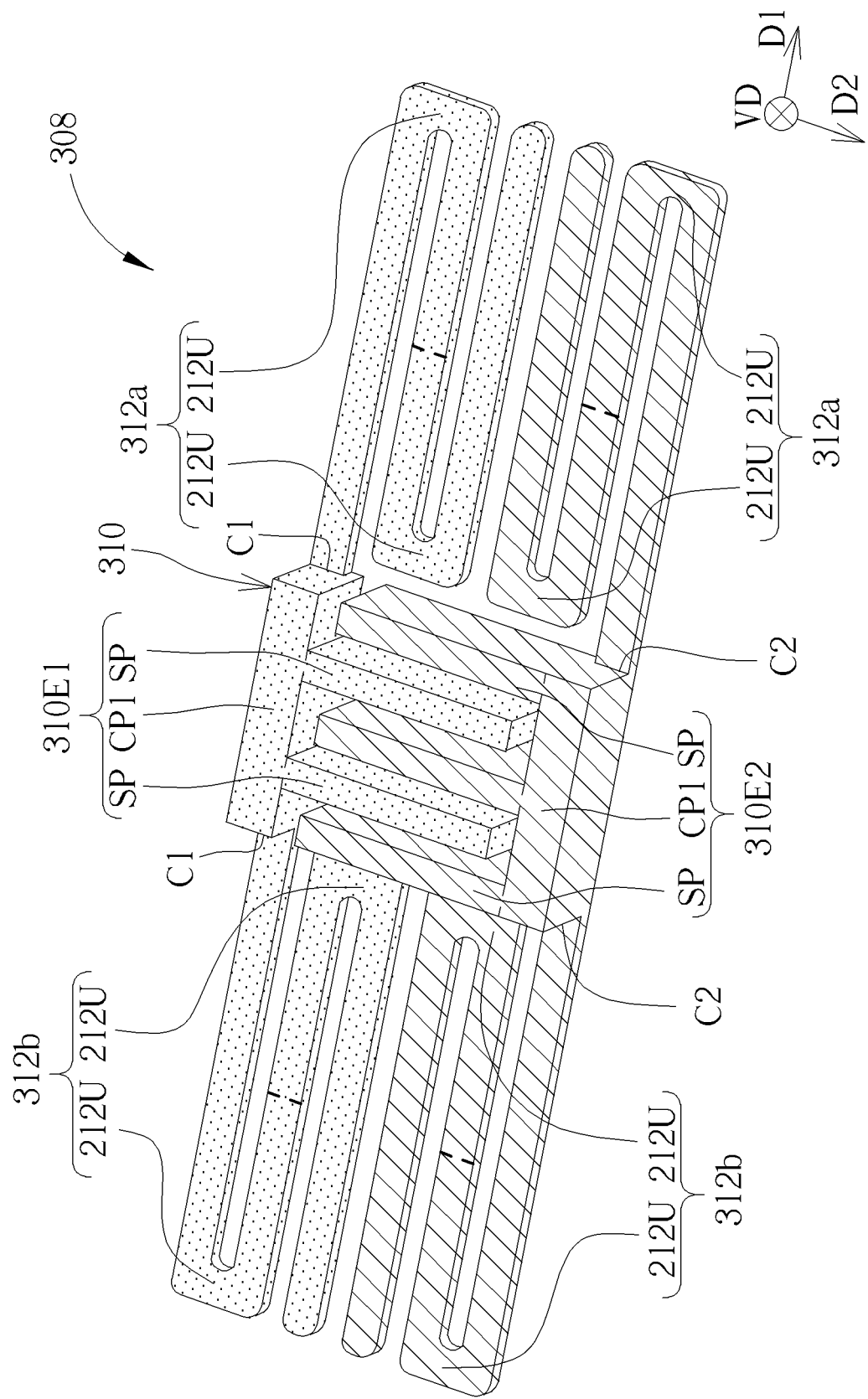
FIG. 8 schematically illustrates a top view of the head unit according to a third embodiment of the present disclosure.

FIG. 8 schematically illustrates a top view of the head unit according to a third embodiment of the present disclosure. As shown in FIG. 8, a difference between a head unit 308 and the head unit shown in FIG. 6 or FIG. 7 is that a shape of a sub-electrode 310E1 and/or a shape of a sub-electrode 310E2 in the top view direction VD may for example be comb-shaped. Specifically, the sub-electrode 310E1 and/or the sub-electrode 310E2 may include a plurality of sub-portions SP and a connecting portion CP1. In the sub-electrode 310E1 and/or the sub-electrode310E2 of some embodiments, the connecting portion CP1 for example is connected to the plurality of sub-portions SP to form a comb shape. In some embodiments, the sub-portions SP of the sub-electrode 310E1 and the sub-portions SP of the sub-electrode 310E2 may for example be arranged alternately or in a staggered manner (spaced part) along the first direction D1, such that an electric field may be formed between the sub-portions SP of the sub-electrode 310E1 and the sub-portions SP of the sub-electrode 310E2, thereby increasing the force of attraction of an electrode 310. In some embodiments, a sub-cantilever 312a and a sub-cantilever 312b connected to the same sub-electrode (such as the sub-electrode 310E1 or the sub-electrode 310E2) may be symmetrical to each other with respect to the sub-electrode (such as the sub-electrode 310E1 or the sub-electrode 310E2). In some embodiments, the sub-cantilever 312a connected to the sub-electrode 310E1 may be symmetrical to the sub-cantilever 312a connected to the sub-electrode 310E2. In some embodiments, the sub-cantilever 312b connected to the sub-electrode 310E1 may be symmetrical to the sub-cantilever 312b connected to the sub-electrode 310E2.

Figure 9:
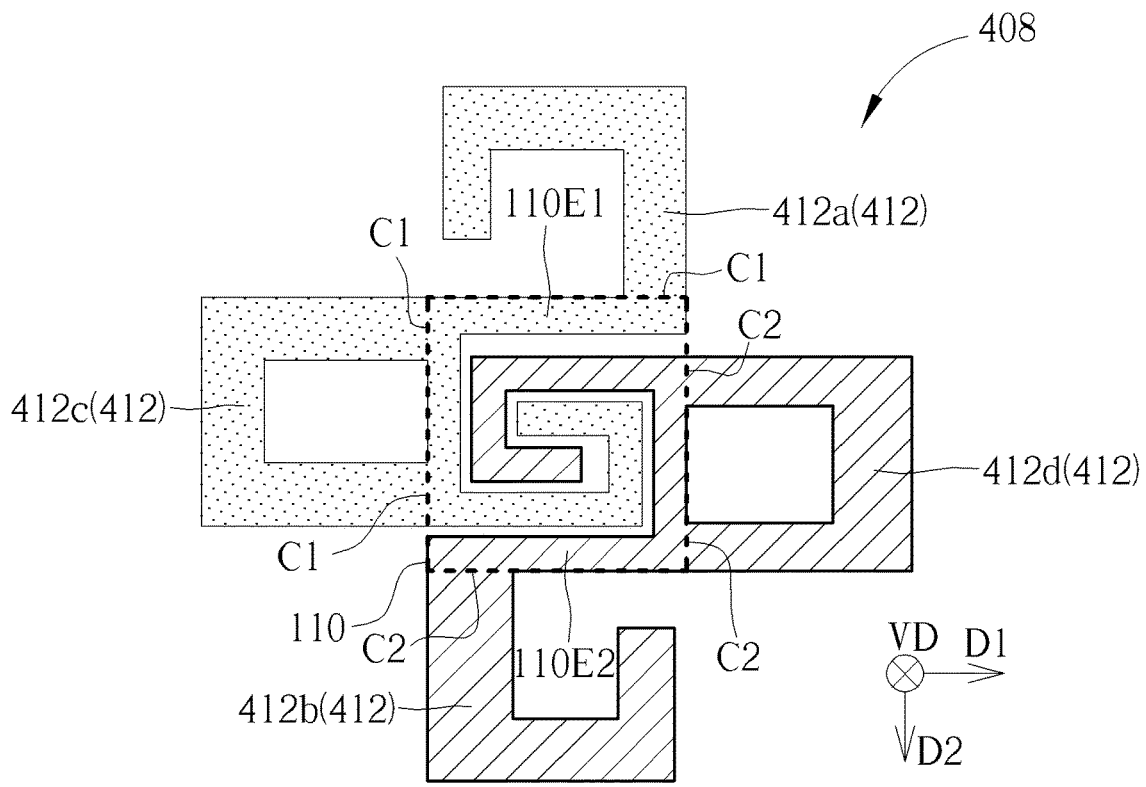
FIG. 9 schematically illustrates a top view of the head unit according to a fourth embodiment of the present disclosure.

FIG. 9 schematically illustrates a top view of the head unit according to a fourth embodiment of the present disclosure. As shown in FIG. 9, a difference between a head unit 408 and the head unit shown in the first embodiment is that the cantilever 412 may include four sub-cantilevers (such as a sub-cantilever 412a, a sub-cantilever 412b, a sub-cantilever 412c and a sub-cantilever 412d) respectively connected to four sides of the electrode 110, but not limited thereto.

In some embodiments, when viewed along the top view direction VD, a shape of the sub-cantilever 412a, a shape of the sub-cantilever 412b, a shape of the sub-cantilever 412c and/or a shape of the sub-cantilever 412d may for example be U-shaped or L-shaped. In some embodiments, an opening of the sub-cantilever 412a, an opening of the sub-cantilever 412b, an opening of the sub-cantilever 412c and/or an opening of the sub-cantilever 412d may for example face the electrode 110. In some embodiments, at least one end of the sub-cantilever 412a, at least one end of the sub-cantilever 412b, at least one end of the sub-cantilever 412c and/or at least one end of the sub-cantilever 412d may be connected to the electrode 110. For example, an end of the sub-cantilever 412a may be connected to the sub-electrode 110E1, and another end may be separated from the sub-electrode 110E1. An end of the sub-cantilever 412b may be connected to the sub-electrode 110E2, and another end may be separated from the sub-electrode 110E2. In some embodiments, both ends of the sub-cantilever 412c may be connected to the sub-electrode 110E1. In some embodiments, both ends of the sub-cantilever 412d may be connected to the sub-electrode 110E2.

Figure 10:
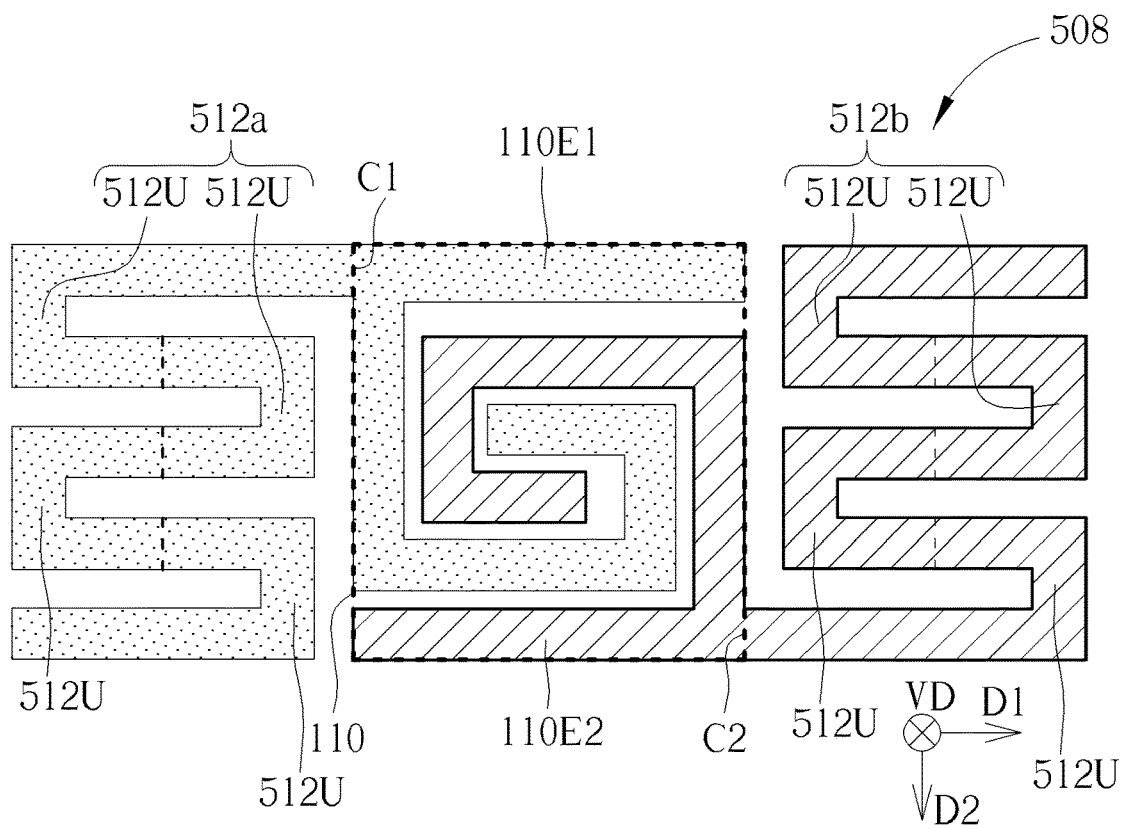
FIG. 10 schematically illustrates a top view of the head unit according to a fifth embodiment of the present disclosure.

FIG. 10 schematically illustrates a top view of the head unit according to a fifth embodiment of the present disclosure. As shown in FIG. 10, a difference between a head unit 508 and the head unit of previous embodiments is that a sub-cantilever 512a and a sub-cantilever 512b respectively connected to the sub-electrode 110E1 and the sub-electrode 110E2 may include a plurality of U-shaped portions 512U, and openings of the U-shaped portions 512U face the left and the right respectively. In some embodiments, the U-shaped portions 512U of the sub-cantilever 512a and/or the U-shaped portions 512U of the sub-cantilever 512b may for example be connected to each other to form a serpentine shape while being connected to the corresponding sub-electrode 110E1 and/or the corresponding sub-electrode 110E2 on one end. In some embodiments, a plurality of sub-cantilevers may be connected to different corners of the electrode depending on requirements. In some embodiments (not illustrated), different sub-cantilevers may for example be separately disposed on two opposite sides of the electrode, but are not limited thereto. In some embodiments (not illustrated), different sub-cantilevers may for example be separately disposed on adjacent two sides of the electrode.

In summary, the transferring head of the present disclosure has the bent sub-cantilever that allows the electrode supported by the cantilevers to not only have freedom of movement in a vertical direction, but also to have freedom of rotation; therefore, degrees of freedom of the picking surface of the electrode contacting the corresponding microcomponent can be increased. Additionally, when different microcomponents with differing surface heights or tilted surfaces need to be picked up, the picking surface of the transferring head may match with the surface of the corresponding microcomponent in order to increase the contact area between the picking surface and the corresponding microcomponent, thereby improving a probability of successful pickup, or reducing damages to the microcomponent. Furthermore, by means of patterned electrodes, the present disclosure allows lengths of corresponding sides of the sub-electrodes (i.e. the length of the fringe electric field) to increase. Therefore, when the voltage difference is applied between the sub-electrodes, the force of attraction provided by the electrode may increase, thereby reducing pickup failures or missed pickups.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A transferring head, comprising:
a substrate;
a head unit, comprising an electrode and a cantilever supporting the electrode; and
a plurality of connecting elements, wherein two adjacent connecting elements of the plurality of connecting elements are disposed between the substrate and the head unit,
wherein the electrode and a part of the cantilever are suspended over the substrate, and the cantilever is connected between one of the plurality of connecting elements and the electrode,
wherein the plurality of connecting elements are not overlapped with the electrode when viewed along a normal direction of the substrate.

2. The transferring head according to claim 1, wherein the cantilever comprises a U-shaped portion when viewed along the normal direction of the substrate.

3. The transferring head according to claim 1, wherein the electrode comprises a first electrode and a second electrode, and the first electrode and the second electrode are spaced apart from each other and electrically insulated from each other.

4. The transferring head according to claim 3, wherein the first electrode is comb-shaped.

5. The transferring head according to claim 3, wherein the first electrode is spiral-shaped.

6. The transferring head according to claim 3, wherein the cantilever comprises a first cantilever supporting the first electrode and a second cantilever supporting the second electrode.

7. The transferring head according to claim 6, wherein the first electrode is connected to an end of the first cantilever, and the second electrode is connected to an end of the second cantilever.

8. The transferring head according to claim 6, wherein the first cantilever is connected to one of the two adjacent connecting elements, and the second cantilever is connected to another of the two adjacent connecting elements.

9. A method for manufacturing an electronic device, comprising:
providing a plurality of microcomponents on a first substrate;
providing a transferring head, wherein the transferring head comprises an electrode including a first electrode and a second electrode spaced apart from each other;
applying different voltages to the first electrode and the second electrode respectively such that an electric field is generated between the first electrode and the second electrode, thereby causing electrostatic induction between the electrode and at least one of the plurality of microcomponents; and transferring the at least one of the plurality of microcomponents from the first substrate to a second substrate by the transferring head.

10. The method according to claim 9, wherein a difference between the voltages respectively applied to the first electrode and the second electrode is greater than 0V and less than or equal to 110V.

11. The method according to claim 10, wherein the difference is greater than or equal to 10V and less than or equal to 80V.

12. The method according to claim 9, wherein the first electrode is comb-shaped.

13. The method according to claim 9, wherein the first electrode is spiral-shaped.

14. The method according to claim 9, wherein a gap is located between the first electrode and the second electrode, and the gap is greater than or equal to 3 μm and less than or equal to 500 μm.

* * * * *